(12) United States Patent
Zhang et al.

(10) Patent No.: US 8,636,937 B2
(45) Date of Patent: Jan. 28, 2014

(54) HIERARCHICAL NANOPATTERNS BY NANOIMPRINT LITHOGRAPHY

(75) Inventors: Fengxiang Zhang, Singapore (SG); Hong Yee Low, Singapore (SG)

(73) Assignee: Agency for Science, Technology and Research, Centros (SG)

( * ) Notice: Subject to any disclaimer, the term of this patent is extended or adjusted under 35 U.S.C. 154(b) by 1377 days.

(21) Appl. No.: 12/083,829

(22) PCT Filed: Oct. 20, 2005

(86) PCT No.: PCT/SG2005/000364
§ 371 (c)(1),
(2), (4) Date: Apr. 18, 2008

(87) PCT Pub. No.: WO2007/046772
PCT Pub. Date: Apr. 26, 2007

(65) Prior Publication Data
US 2009/0047478 A1    Feb. 19, 2009

(51) Int. Cl.
*B29C 59/02*    (2006.01)
(52) U.S. Cl.
USPC ............................ 264/294; 264/296; 977/887
(58) Field of Classification Search
USPC .................................. 264/294, 296; 977/887
See application file for complete search history.

(56) References Cited

U.S. PATENT DOCUMENTS

2004/0231781 A1*    11/2004    Bao et al. ...................... 156/230

FOREIGN PATENT DOCUMENTS

WO    03/096123 A1    11/2003
WO    2004/044654 A2    5/2004

OTHER PUBLICATIONS

Bao et al., Nanoimprinting over topography and multilayer three-dimensional printing, J. Vac. Sci. Technol. B 20(6), Nov./Dec. 2002 p. 2881-2886.*
Chou et al., "Imprint of sub-25 nm vias and trenches in polymers" *Appl. Phys. Lett.* 67(21):3114-3116 (Nov. 20, 1995).
Cross et al., "Instrumented indentation testing for local characterization of polymer properties after nanoimprint" *Microelectronic Engineering* 78-79 (Jan. 2005) 618-624.
Guo, L.J., "Recent progress in nanoimprint technology and its applications" *Phys. D: Appl. Phys.* 37 (May 2004) R123-R141.
Zhang et al., "Multilevel nanoimprint lithography with submicron alignment over4 in. Si wafers" *Appl. Phys. Lett.* 79(6):845-847 (Aug. 2001).

* cited by examiner

*Primary Examiner* — Galen Hauth
(74) *Attorney, Agent, or Firm* — Jacobson Holman PLLC (57) ABSTRACT

A method for forming hierarchical patterns on an article by nanoimprinting is disclosed. The method includes using a first mold to form a primary pattern on the article at a first temperature and a first pressure, the first temperature and the first pressure being able to reduce the elastic modulus of the article; and using a second mold to form a second pattern on the primary pattern at a second temperature that is below the article's glass transition temperature, the forming of the second pattern being at a second pressure.

19 Claims, 8 Drawing Sheets

HIERARCHICAL NANOPATTERNS BY NANOIMPRINT LITHOGRAPHY

This is a national stage of PCT/SG2005/000364 filed Oct. 20, 2005 and published in English.

FIELD OF THE INVENTION

This invention relates a method forming hierarchical patterns by nanoimprinting and relates particularly though not exclusively to a method for forming ordered three dimensional (3-D) hierarchical structures.

BACKGROUND OF THE INVENTION

Development of hierarchical or three-dimensional structures at the sub-micrometer scale is becoming increasingly important with technological advances in microelectromechanical and nanoelectromechanical systems, microfluidic devices, microoptics or nano-optics, toolsets for biologists (microfluidic chips for deoxyribose nucleic acid array), and medicine (microsurgical tools).

Hierarchical structures are responsible for some unique properties in the natural world such as the extreme surface hydrophobicity of a lotus leaf, the super water-repellency of a water strider's leg, and the reduced water resistance of a shark's skin. Man-made applications include the application of a plastic coating with hierarchical surface topology on aircraft for drag reduction.

Currently available fabrication techniques include micro stereo lithography, a combination process of deep reactive ion etching and bulk micromachining, inclined deep X-ray lithography, and inclined ultraviolet lithography. All have demonstrated three dimensional microstructures and nanostructures. However, fabrication of hierarchical structures has not been possible. Most hierarchical structures reported were obtained from a self-assembly method. However, the fidelity of such structures and their long-range order are poor. These techniques are also low in throughput.

Since the publication by Chou et. al Stephen Y. Chou, Peter R. Krauss, Preston J. Renstrom, Appl. Phys. Lett 67 (1995) 3114, nanoimprint lithography ("NIL") has been recognized as an attractive technique particularly for fabrication of two dimensional nanostructures. The primary working principle of nanoimprint lithography relies on the viscoelastic properties of polymers. In this way, a polymer film is heated to above its glass transition temperature (Tg). The polymer will then flow and acquire the topology of a hard mould. The pattern is set when the polymer is cooled to its glassy state. Therefore, the pattern resolution is primarily determined by the hard mould.

SUMMARY OF THE INVENTION

In accordance with a first preferred aspect there is provided a method for forming hierarchical patterns on an article by nanoimprinting, the method comprising:

(a) using a first mould to form a primary pattern on the article at a first temperature and a first pressure, the first temperature and the first pressure being able to reduce the elastic modulus of the article;

(b) using a second mould to form a second pattern on the primary pattern at a second temperature that is below the article's glass transition temperature, the forming of the second pattern being at a second pressure.

The first temperature and pressure may be also able to reduce the melt viscosity of the article. The first temperature is preferably above the glass transition temperature of the article. The article may be a polymer film, and may be one or more of: polycarbonate, polymethylmethacrylate, and a polyimide with hydroxyl side groups. The polymer film may be a polymer composite reinforced with particles selected from: calcium carbonate, carbon filler, glass filler, fibers, glass fibers, carbon fibers, and carbon nanotubes. The polymer film may be on a substrate.

The secondary pattern may be formed at an angle relative to the primary pattern, the angle being in the range 0° to 90°.

At least one of the first mould and the second mould may be treated with a low surface energy coating for a facilitating their release from the article. The coating may be perfluorodecyltrichlorosilane.

The first mould may have a first grating for forming a first grating structure on the article, and the second mould may have second grating for forming a second grating structure on the first grating structure. The first grating may be larger than the second grating. Alternatively, the first grating may be smaller than or may be the same as the second grating. The first grating structure may be protrusions and trenches on the article. The second grating may be formed on the protrusions and in the trenches. The first grating may be 2 micrometers and the second grating may be 250 nanometers. The first grating and the second grating may have different geometries.

Preferably, the first temperature is in the range of 120° C. to 200° C.; the secondary temperature is in the range of 60° C. to 200° C.; the primary pressure is in the range of 40 bar to 50 bar; and the secondary pressure is in the range of 10 bar to 50 bar.

More preferably, residual solvent is removed from the article. The polyimide with hydroxyl side groups may be a porous film.

According to a further preferred aspect there is included a product produced by the above method.

BRIEF DESCRIPTION OF THE DRAWINGS

In order that the present invention may be fully understood and readily put into practical effect, there shall now be described by way of non-limitative example only preferred embodiments of the present invention, the description being with reference to the accompanying illustrative drawings.

In the drawings.

DETAILED DESCRIPTION OF THE PREFERRED EMBODIMENTS

Figure 1:
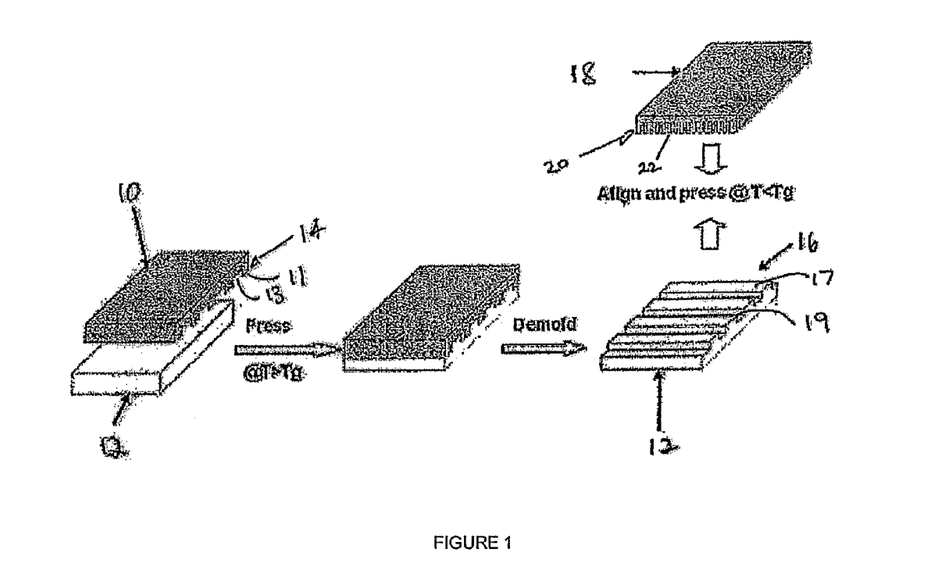
FIG. 1 is a schematic illustration of the method for hierarchical nanoimprinting.

The process for fabrication of hierarchical nanostructure is schematically shown in FIG. 1. A first mould 10 having a first grating 14 that comprises protrusions 11 and trenches 13 is first pressed against a polymer film 12, either free standing or supported on a substrate 15. This is preferably at a temperature above the glass transition temperature, Tg, of the polymer film 12. The pressure used is predetermined. The combination of the pressure and temperature should be sufficient to reduce the modulus of the film 12. Preferably, the temperature and pressure are sufficient to reduce the elastic modulus and the elastic viscosity of the film 12. Upon demoulding, a primary pattern 16 of protrusions 17 and trenches 19 is created in the polymer film 12. In the next step, a second mould 18 having a second grating 20 is used. The second grating 20 may be different to the first grating 14, or may be the same as the first grating 14. The second mould 18 is then is aligned at a predetermined orientation relative to the polymer film 12 and pressed against the pre-patterned polymer film 12 at a temperature below Tg, preferably well below Tg, to create a secondary pattern over, but without destroying, the first pattern 16. Likewise, a tertiary or higher-order pattern can be progressively produced. The second grating 20 may be a larger number of closely-packed spikes 22. The first grating 14 and the second grating 20 may be of different geometries, if required or desired. They may also be of sizes that are different, or may be the same.

In the above process, the use of an imprinting temperature below Tg in the secondary or higher-order imprints is to insure that the primary pattern is not destroyed during the subsequent imprints.

By varying the alignment between the two imprinting steps and controlling the imprinting conditions for the subsequent imprinting, a variety of sophisticated hierarchical patterns may be obtained. Imprinting recipes may be optimized so that deformation of the primary pattern 16 is minimized. The imprinting temperature for the second and subsequent imprinting should be at a temperature lower than Tg of the polymer 12. Subsequent imprinting pressure and time duration also have a significant influence on the final feature of the resultant hierarchical structure.

Suitable polymer films 12 include films of different polymers such as for example, polycarbonate (PC), polymethylmethacrylate ("PMMA") and an synthesized polyimide with hydroxyl side groups (HPI). Their Tg's are 150° C., 105° C. and 415° C., respectively. The polymer film 12 may also be a polymer composite reinforced with particles such as, for example, calcium carbonate, carbon filler, glass filler, fibers, glass fibers, carbon fibers, and carbon nanotubes.

Example 1

In this example is described a series of hierarchical imprinting on freestanding films of polycarbonate ("PC"), Tg=150° C. A primary pattern is first imprinted on the films using a 2 μm grating 14 mould 10 with the grating 14 being in $SiO_2$ and being treated with oxygen plasma. The imprinting is for 5 minutes at 180° and 40 bar and results in a 2 μm grating structure 16 on the film 12. The secondary imprint is subsequently carried out using a 250 nm grating 10 mould 18 in $SiO_2$ also treated with oxygen plasma. The first mould 10 has a grating 14 that is larger than the grating 18 of the second mould 18.

Figure 2:
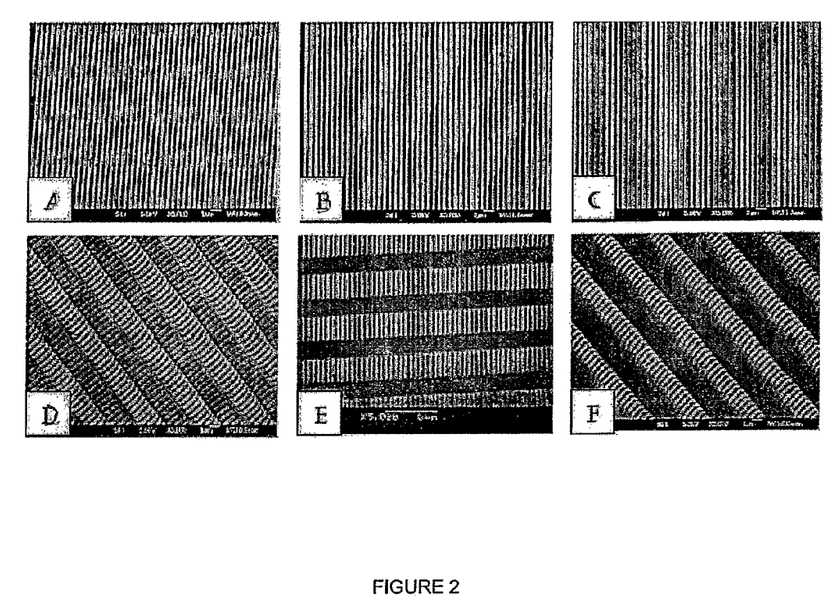
FIG. 2 is a series of SEM images of patterns in a freestanding PC film.

The hierarchical structure depends strongly on the imprinting recipe and the alignment of mould 18 in the secondary and subsequent imprints. When the secondary imprint is carried out at 100° C. (50° C. below Tg) and 49 bar, a 250 nm grating structure is created over the entire primary grating structure, i.e. both the protrusions 17 and the trench 19 are imprinted. The resulting structure is shown in FIG. 2A. In this example, the secondary imprint is at a perpendicular (i.e. 90°) alignment with respect to the primary pattern. With the same imprinting temperature and pressure, different hierarchical nanostructures are obtained when 45° or parallel (i.e. 0°) alignment is employed (FIGS. 2B and 2C respectively).

By lowering the second imprinting temperature to 80° C. and at a pressure of 40 bar, the 250 nm imprint is created in the protrusion of the primary pattern (FIG. 2D); but at 80° C. and 10 bar, only a slight imprint is observed at the trench bottom (FIG. 2E). Further lowering the imprinting temperature to 70° C. (more than 50% below Tg) and the pressure to 10 bar, virtually no imprint is observed at the trench bottom (FIG. 2F). These worked only on a pre-imprinted polymer. When used on a flat film, imprinting did not occur.

The second imprint cuts into the first imprint over the entire grating structure 16 and may result in some flattening of the protrusions 17 due to the applied pressure, but this does not undermine the hierarchical structure.

As seen from the above description, nanoimprinting occurs in pre-patterned PC films at temperatures as low as 100° C. to 70° C. (50° C.-80° C. below the Tg of the polymer). Nanoimprinting occurs because the polymer becomes softer after the primary imprinting. The polymer becomes softer because the elastic modulus of the polymer is lower. Also, the melt viscosity of the polymer may be lower.

Example 2

Hierarchical nanoimprinting is conducted on substrate-supported thin films. In this example, either or both moulds 10, 18 are treated with a low-surface-energy perfluorodecyltrichlorosilane ("FDTS") to facilitate their release from the films after imprinting. The silane treatment allows a higher yield of patterning, without which the polymer film may adhere to the mould 10, 18 during demoulding.

Figure 3:
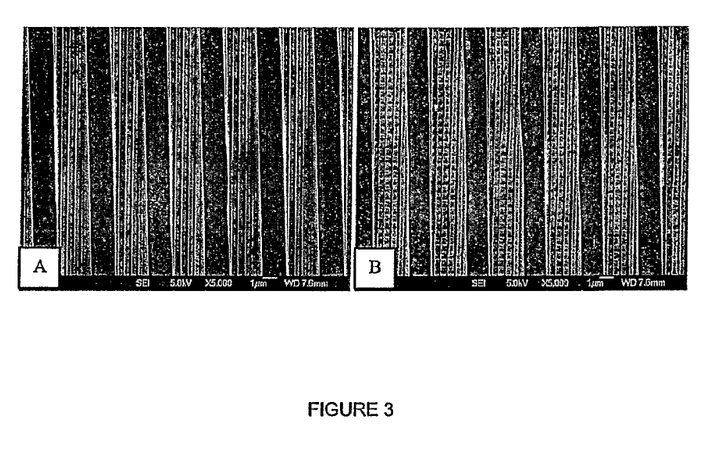
FIG. 3 is a series of SEM images of patterns on a substrate-supported PC film.

A 5% wt PC solution in tetrahydrofuran (THF) is spin coated onto a bare silicon wafer sonicated in heptane or isopropanol and then rinsed with acetone, without plasma treatment, and blown dry with compressed nitrogen. Spinning is at 6000 rpm for 30 seconds to give a film with thickness of about 400 nm. The film is then baked in air at 80° C. for 5 min to remove any residual solvent. Next, the film is imprinted with mould 10 ($O_2$ plasma and FDTS treated) at 160° C., 40 bar for 2 min and then separated. Mould 18 ($O_2$ plasma and FDTS treated) is subsequently aligned in parallel patterns and pressed at 80° C. and 15 bar for 30 s. By doing so, protrusions of 2 micron grating are lengthwise "sliced" by the 250 nm grating, while the trench bottoms remain intact (FIG. 3-A). When the resultant structure is further imprinted by mould 18 (aligned vertically to the secondary pattern), a tertiary pattern results and gives rise to the formation of nano-squares on the protrusions of the 2 micron grating (FIG. 3-B).

In both the two-step and three-step sequences, the 250 nm secondary and tertiary gratings are created at 80° C. and 15 bar.

Example 3

In this example, films of 400 nm thick polymethylmethacrylate (PMMA, Tg=105° C.) are imprinted hierarchically. The film is prepared in the same way as the PC of examples 1 and 2, except that the solvent used is toluene. Imprinting consists of 120° C., 40 bar for 120 s for the first step (with FDTS treated mould 10) and 60° C.-70° C., 40 bar for 120 s for the second step (with FDTS treated mould 18 aligned vertically or horizontally to the previous grating).

Figure 4:
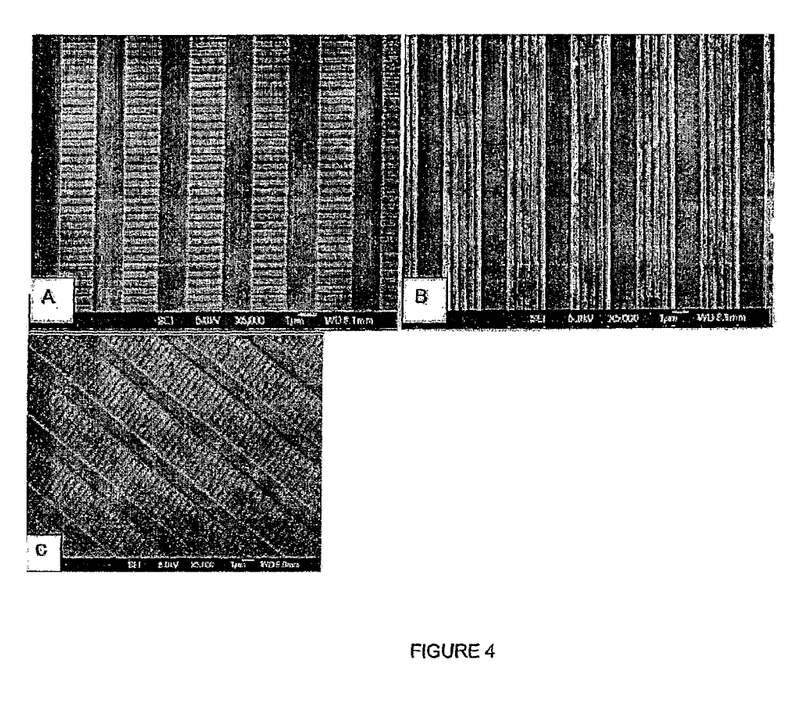
FIG. 4 is a series of SEM images of patterns on PMMA films spun onto silicon substrates.

SEM images of the different patterns created are shown in FIG. 4, which shows a secondary 250 nm grating with good resolution on the 2 micron protrusions.

Figure 5:
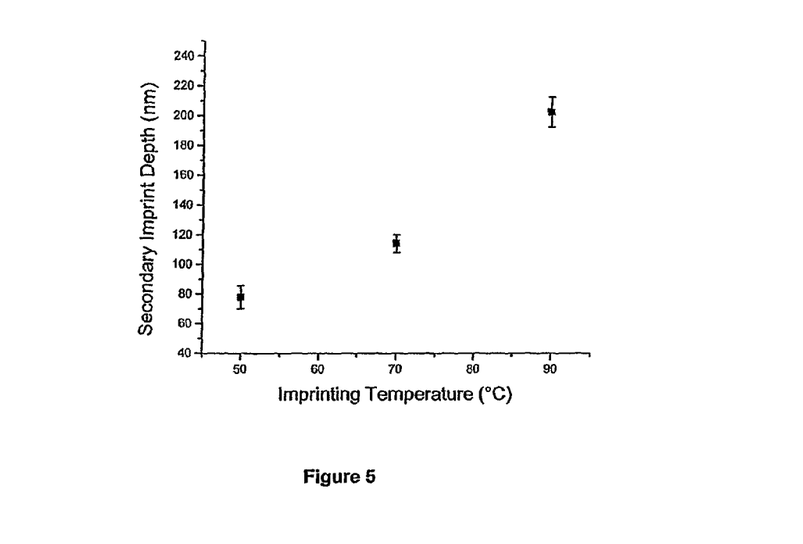
FIG. 5 is a graph of correlation between the secondary imprint depth and imprint temperature (for PMMA spin coated films)

To further illustrate this embodiment, an AFM line scan was used to measure the depth of the second imprint. This used a spin coated PMMA film supported on an Si substrate. FIG. 5 shows that the imprint depth is controlled by the imprinting temperature. As seen in FIG. 5, the secondary imprinting temperature was between 90 degrees C. and 50 degrees C., and the imprint depth varies from about 200 nm to 80 nm from a 250 nm deep grating mould. The temperature range is below the Tg of the PMMA film. At these temperatures, imprinting may not occur on a flat or a spin coated PMMA film.

Figure 6:
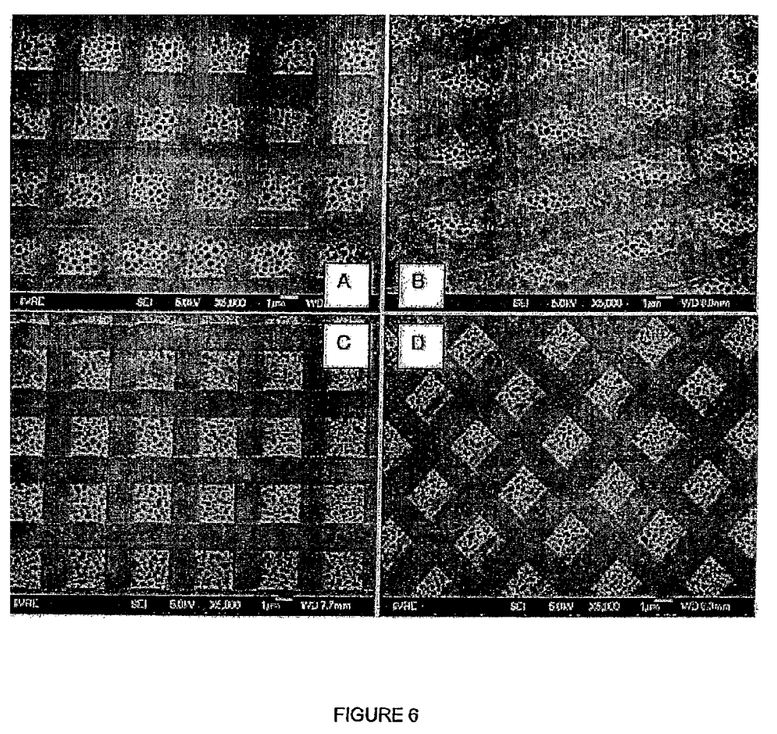
FIG. 6 is a series of SEM images of patterns on HPI spin-coated film.

Hierarchical imprinting may also be achieved when a porous material is used. A synthesized HPI (a polyimide with hydroxyl side groups) demonstrates this. A 2.5% (by weight) HPI solution in THF is spun onto a Si substrate at 5500 rpm for 30 s to give a porous film about 250 nm thick. After baking for residual solvent removal, the film undergoes two consecutive imprints both with FDTS treated mould 10. When the two imprints are performed both at 200° C., 50 bar for 120 s or 300 s, parallelogram, diamond and square features result. The SEM images are shown in FIG. 6.

The pores in the imprinted regions collapse partially or completely so that hybrid films with ordered arrays of porous domains result. In addition, there is little or no deformation in the resultant hierarchical structures. This difference may be attributed to the porous structure of the HPI film, which can alleviate or dissipate stresses produced during the imprinting process. The presence of pores enhances the first imprint taking place at a temperature below the Tg of the polymer, as the imprint does not happen under the same conditions as on non-porous HPI films.

Mechanism for Hierarchical NIL

In order to demonstrate the mechanism of the hierarchical patterning, Atomic Force Microscope (AFM) nanoindentation was conducted on plain PC film and protrusions of the 2 μm grating imprinted in the PC film. The elastic modulus of the PC was independently determined to be 2.8 GPa using a Triboindenter. The elastic modulus of the imprinted sample was evaluated using a comparison method reported by Wang et al. M. Wang, H. J. Jin, D. L. Kaplan and G. C. Rutledge, Macromolecules 2004, 37, 6856-686:

$$\frac{S_1}{S_2} = \frac{r_1 E_1}{r_2 E_2} \quad (1)$$

where S is the slope of the unloading curve at $P_{max}$, P is the applied load, r is radius of indentation contact and E is elastic modulus. Subscripts 1 and 2 denote imprinted and plain samples, respectively. The method measures the relative modulus, which is adequate for the present purposes.

Figure 7:
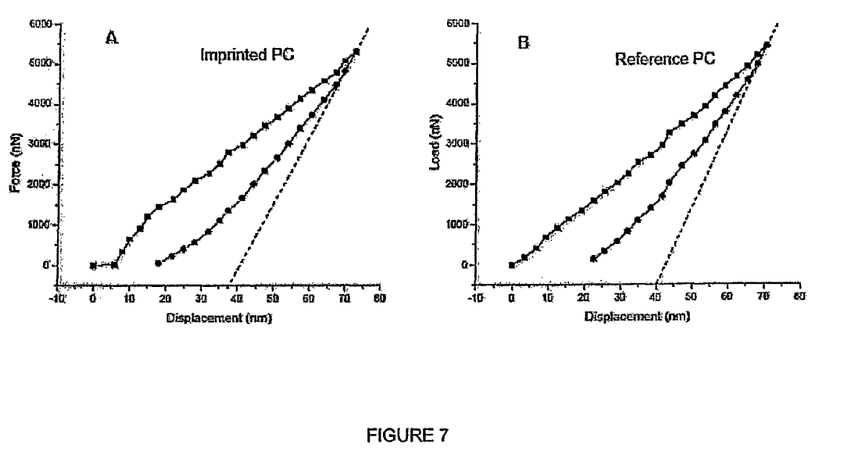
FIG. 7 is two graphs of load and displacement nanoindentation curves.
Figure 8:
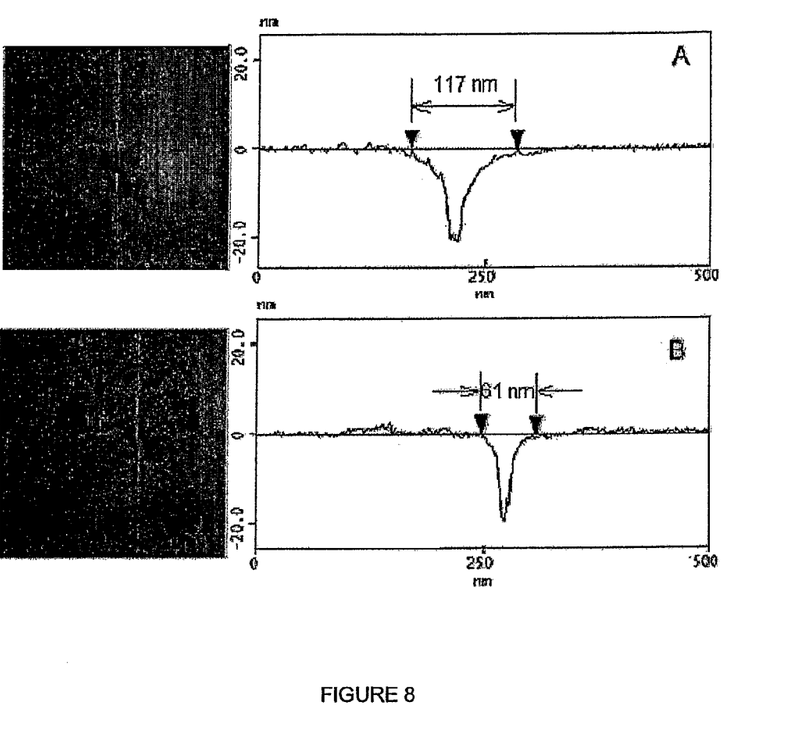
FIG. 8 is an illustration of tapping-mode AFM images.

The load versus displacement curves obtained for both samples are shown in FIG. 7, from which $S_1$ and $S_2$ are approximated to be 180 and 200, respectively. In FIG. 7 the dashed line is the approximated tangential line at $P_{max}$. AFM section profiles (FIG. 8) provide the contact sizes ("r" in eq. 1) of the Indents, which are 117 nm for the imprinted sample and 61 nm for the pristine film, where A is the imprinted film and B is the pristine film.

The modulus of imprinted PC was evaluated to be 1.3 GPa using eq. 1, which is about 50% lower than that for the pristine PC film (2.8 GPa).

Figure 9:
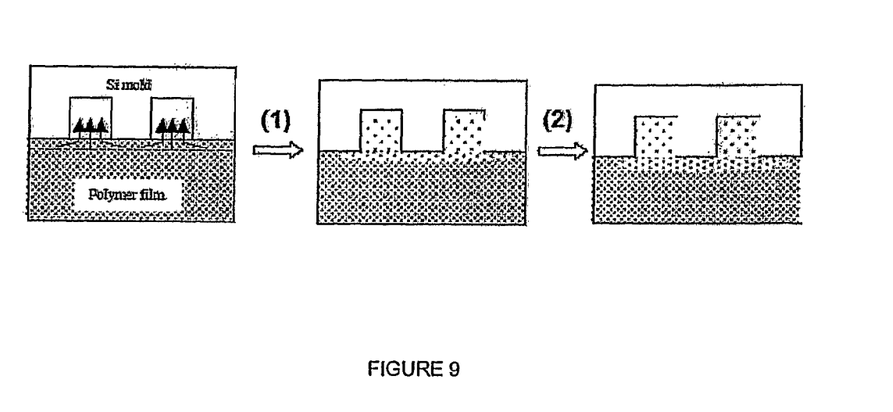
FIG. 9 is an illustration for polymer flow.

The reduced elastic modulus is a result of the 'flow' of the polymer to fill in the trenches of the mould during the imprinting process. FIG. 9 shows an illustration of this process. When a mould is pressed against a polymer film at above Tg, the polymer melt at immediate vicinity of the mould protrusions flows into the mould trenches, which have a relatively large free space for the polymer chains to expand. At the same time, the polymer melt at vicinity of the mould protrusions also becomes thinner due to outward polymer flow. As a result, the free volume of the polymer in the trenches of the mould is higher that that before the imprinting process. A higher free volume is believed to account for the lower modulus in the protrusions of the imprinted polymer, thus allowing the secondary or subsequent imprint to be carried out at a lower temperature and pressure without the infusion of a plasticer such as an organic solvent. The use of such plasticers is undesirable as it may cause changes to the properties of the polymer, and the surrounding component and/or substrate.

Silicon grating moulds 10, 18 of 2 μm and 250 nm pitch respectively (both with 1:1 duty cycle) may be manufactured by photolithography and reactive ion etching. The moulds are preferably cleaned with acetone, isopropanol and oxygen plasma (80 W, 250 mTorr for 2 min). In the case of imprinting on substrate-supported thin films, the moulds may be further treated with perfluorodecyltrichlorosilane (FDTS, 20 mM in heptane) in a nitrogen glove box. The relative humidity may be kept at 15% to 18%.

In hierarchical nanoimprinting of PC, all the primary imprints (i.e. 2 μm grating) may be done at 180° C. or 160° C. and 40 bar; for PMMA, the primary imprints were made at 120° C. and 40 bar.

Nanoindentations may be performed using MultiMode AFM (Veeco Instruments) with Nanoscope IV controller and silicon tip (RTESP model, nominal tip radius of curvature smaller than 10 nm). The spring constant and resonant frequency of the cantilever are 70 N/m and 259 kHz, respectively. The system may be force controlled, as opposed to displacement controlled. The maximum applied load may be controlled to ±1% or better accuracy by setting an appropriate trigger set point of the deflection signal. All indentations were made using the same loading/unloading rate, 1 Hz. A 25° compensation of the probe during the indentation was used to prevent the cantilever from plowing the surface laterally, typically along the x direction. The AFM indentation procedure consisted of three stages. First, the sample was inspected by AFM using tapping mode to locate the sample for indentation. Then AFM was switched to force mode and the indentation performed. Finally, it was switched back to tapping mode to image the indented area.

Whilst there has been described in the foregoing description preferred embodiments of the present invention, it will be understood by those skilled in the technology concerned that many variations or modifications in details of design or construction may be made without departing from the present invention.

The invention claimed is:

1. A method for forming hierarchical patterns on an article by nanoimprinting, the method comprising:
    (a) using a first mould to imprint a primary pattern on the article at a first temperature and a first pressure, the first temperature and the first pressure being able to reduce the elastic modulus of the article, the primary pattern comprising protrusions;
    (b) using a second mould to imprint a second pattern in the protrusions of the primary pattern at a second temperature that is below the article's glass transition temperature, the imprinting of the second pattern being at a second pressure.

2. A method as claimed in claim 1, wherein the first temperature and pressure are also able to reduce the melt viscosity of the article.

3. A method as claimed in claim 1, wherein the first temperature is above the article's glass transition temperature.

4. A method as claimed in claim 1, wherein the article is a polymer film.

5. A method as claimed in claim 4, wherein the polymer film is selected from the group consisting of: thermoplastic polymers, polycarbonate, polymethylmethacrylate, porous polymers, and polyimide with hydroxyl side groups.

6. A method as claimed in claim 4, wherein the polymer film is a polymer composite reinforced with particles selected from the group consisting of: calcium carbonate, carbon filler, glass filler, fibers, glass fibers, carbon fibers, and carbon nanotubes.

7. A method as claimed in claim 4, wherein the polymer film is on a substrate.

8. A method as claimed in claim 1, wherein the secondary pattern is formed at an angle relative to the primary pattern, the angle being in the range 0° to 90°.

9. A method as claimed in claim 1, wherein at least one of the first mould and the second mould is treated with a low surface energy coating for facilitating their release from the article.

10. A method as claimed in claim 9, wherein the coating is perfluorodecyltrichlorosilane.

11. A method as claimed in claim 1, wherein the first mould has a first grating for forming a first grating structure on the article, and the second mould has second grating for forming a second grating structure on the first grating structure.

12. A method as claimed in claim 11, wherein the first grating is of a size relative to the second grating that is selected from the group consisting of: the same, larger, and smaller.

13. A method as claimed in claim 11, wherein the first grating and the second grating have different geometries.

14. A method as claimed in claim 11, wherein the first grating structure is protrusions and trenches on the article.

15. A method as claimed in claim 14 wherein the second grating is formed on the protrusions and in the trenches.

16. A method as claimed in claim 11, wherein the first grating is of a 2 micrometers pitch and the second grating is of a 250 nanometers pitch.

17. A method as claimed in claim 1, wherein:
(a) the first temperature is in the range of 120° C. to 200° C.;
(b) the second temperature is in the range of 60° C. to 200° C.;
(c) the first pressure is in the range of 40 bar to 50 bar; and
(d) the second pressure is in the range of 10 bar to 50 bar.

18. A method as claimed in claim 1, wherein before step (a) any residual solvent is removed from the article.

19. A method as claimed in claim 5, wherein the polyimide with hydroxyl side groups is a porous film.

* * * * *

UNITED STATES PATENT AND TRADEMARK OFFICE
CERTIFICATE OF CORRECTION

PATENT NO. : 8,636,937 B2  Page 1 of 1
APPLICATION NO. : 12/083829
DATED : January 28, 2014
INVENTOR(S) : Zhang et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1502 days.

Signed and Sealed this
Twenty-second Day of September, 2015

Michelle K. Lee
*Director of the United States Patent and Trademark Office*